US012740300B2

(12) United States Patent
Cho et al.

(10) Patent No.: US 12,740,300 B2
(45) Date of Patent: Sep. 15, 2026

(54) DISPLAY DEVICE INCLUDING LIGHT ABSORBING LAYER AND ANTI-REFLECTION LAYERS

(71) Applicant: LG Display Co., Ltd., Seoul (KR)

(72) Inventors: KwangNam Cho, Seoul (KR); Wonyeol Choi, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 736 days.

(21) Appl. No.: 18/060,871

(22) Filed: Dec. 1, 2022

(65) Prior Publication Data

US 2023/0209869 A1 Jun. 29, 2023

(30) Foreign Application Priority Data

Dec. 27, 2021 (KR) ........................ 10-2021-0188191

(51) Int. Cl.

| | |
|---|---|
| ***H10K 59/80*** | (2023.01) |
| ***H10K 59/40*** | (2023.01) |
| *H10K 59/122* | (2023.01) |
| *H10K 102/00* | (2023.01) |

(52) U.S. Cl.

CPC ......... *H10K 59/8792* (2023.02); *H10K 59/40* (2023.02); *H10K 59/873* (2023.02); *H10K 59/879* (2023.02); *H10K 59/122* (2023.02); *H10K 2102/00* (2023.02)

(58) Field of Classification Search

CPC .. H10K 50/844; H10K 50/858; H10K 50/865; H10K 50/86; H10K 50/8445; H10K 59/40; H10K 59/873; H10K 59/8791; H10K 59/122; G06F 3/0412; G06F 3/042; G06F 1/13338

See application file for complete search history.

(56) References Cited

U.S. PATENT DOCUMENTS

| | | | | |
|---|---|---|---|---|
| 8,536,781 | B2 | 9/2013 | Lee et al. | |
| 10,153,461 | B1 * | 12/2018 | Liu | H10K 59/8791 |
| 10,502,877 | B2 * | 12/2019 | Koga | G03B 11/00 |
| 2012/0024378 | A1 * | 2/2012 | Lee | H10F 77/315 136/259 |
| 2014/0117330 | A1 | 5/2014 | Cho et al. | |
| 2014/0160396 | A1 | 6/2014 | Chung et al. | |

(Continued)

FOREIGN PATENT DOCUMENTS

| | | |
|---|---|---|
| CN | 103941464 A | 7/2014 |
| CN | 104185909 A | 12/2014 |

(Continued)

*Primary Examiner* — Ida M Soward

(74) *Attorney, Agent, or Firm* — Seed Intellectual Property Law Group LLP

(57) ABSTRACT

A display device is disclosed by the present disclosure. The display device including a first substrate, a display part on the first substrate, an encapsulation part covering the display part and at least two inorganic material-containing layers. The at least two inorganic material-containing layers include a first light absorbing layer, a first anti reflection layer and a second anti reflection layer disposed on the first anti reflection layer and having a smaller refractive index than the first anti reflection layer. Therefore, it is possible to provide a display device in which at least two inorganic material-containing layers are disposed to suppress reflection of external light.

19 Claims, 4 Drawing Sheets

(56) References Cited

U.S. PATENT DOCUMENTS

| | | | | |
|---|---|---|---|---|
| 2014/0204315 | A1 | 7/2014 | Park et al. | |
| 2015/0027541 | A1 | 1/2015 | Baist et al. | |
| 2015/0153779 | A1 | 6/2015 | Ko et al. | |
| 2015/0198853 | A1* | 7/2015 | Park | H10D 86/60 349/137 |
| 2016/0104869 | A1 | 4/2016 | Choi et al. | |
| 2017/0155095 | A1* | 6/2017 | Tsai | H10K 59/879 |
| 2017/0373270 | A1* | 12/2017 | Kim | H10K 77/111 |
| 2018/0101198 | A1* | 4/2018 | Choi | G02B 1/12 |
| 2019/0079338 | A1 | 3/2019 | Liu | |
| 2020/0150534 | A1* | 5/2020 | Uchida | G03F 7/091 |
| 2020/0257026 | A1* | 8/2020 | Ishibashi | G02B 5/205 |
| 2021/0157432 | A1* | 5/2021 | Lee | G06F 3/04166 |
| 2021/0217991 | A1 | 7/2021 | Jung et al. | |
| 2021/0288293 | A1 | 9/2021 | Cho et al. | |
| 2021/0408495 | A1 | 12/2021 | Gu et al. | |
| 2022/0164065 | A1* | 5/2022 | Han | G06F 3/0443 |

FOREIGN PATENT DOCUMENTS

| | | | | | |
|---|---|---|---|---|---|
| CN | 104679369 | A | | 6/2015 | |
| CN | 105514296 | A | | 4/2016 | |
| CN | 107068709 | A | * | 8/2017 | H01L 27/32 |
| CN | 111224016 | A | * | 6/2020 | H01L 27/3234 |
| CN | 111610661 | A | | 9/2020 | |
| CN | 113130592 | A | | 7/2021 | |
| CN | 113394248 | A | | 9/2021 | |
| JP | 2001281415 | A | * | 10/2001 | G02B 1/11 |
| JP | 2005-107208 | A | | 4/2005 | |
| JP | 2016-145922 | A | | 8/2016 | |
| KR | 10-2006-0102446 | | | 9/2006 | |
| KR | 10-2011-0049476 | A | | 5/2011 | |
| KR | 10-2014-0075228 | A | | 6/2014 | |
| KR | 20150040529 | A | | 4/2015 | |
| KR | 20160043227 | A | | 4/2016 | |
| KR | 20210083606 | A | * | 7/2021 | H10K 59/88 |

* cited by examiner

DISPLAY DEVICE INCLUDING LIGHT ABSORBING LAYER AND ANTI-REFLECTION LAYERS

CROSS-REFERENCE TO RELATED APPLICATIONS

This application claims the priority of Korean Patent Application No. 2021-0188191 filed on Dec. 27, 2021, in the Korean Intellectual Property Office, the disclosure of which is incorporated herein by reference.

BACKGROUND

Technical Field

The present disclosure relates to a display device, and more particularly, to a display device capable of suppressing degradation of visibility caused by external light incident into the display device from the outside.

Description of the Related Art

With the advent of the information age, there is a growing demand for display devices for displaying images. Accordingly, various types of display devices, such as a liquid crystal display device and an organic light emitting display device, have been used.

Among these display devices, the organic light emitting display device does not require a separate light source. Therefore, the organic light emitting display device can be manufactured to be light and thin and has process advantages and has low power consumption due to low voltage driving. First of all, the organic light emitting display device includes a self-emitting element and includes layers formed of organic thin films. Therefore, the flexibility and elasticity are superior to the other display devices and thus it is advantageous to be implemented as a flexible display device.

BRIEF SUMMARY

A technical benefit to be achieved by the present disclosure is to provide a display device capable of suppressing degradation of visibility caused by external light incident into the display device from the outside.

Another technical benefit to be achieved by the present disclosure is to provide a display device excellent in blocking moisture permeation.

Yet another technical benefit to be achieved by the present disclosure is to provide a display device with improved touch sensitivity.

Technical benefits of the present disclosure are not limited to the above-mentioned technical benefits, and other technical benefits, which are not mentioned above, can be clearly understood by those skilled in the art from the following descriptions.

According to an aspect of the present disclosure, the display device includes a first substrate and a display part on the first substrate. Also, the display device includes an encapsulation part covering the display part and at least two inorganic material-containing layers. The at least two inorganic material-containing layers include a first light absorbing layer, a first anti reflection layer and a second anti reflection layer disposed on the first anti reflection layer and having a smaller refractive index than the first anti reflection layer.

Other detailed matters of the embodiments are included in the detailed description and the drawings.

According to the present disclosure, the at least two inorganic material-containing layers disposed within a display device can suppress reflection of external light incident into the display device from the outside.

According to the present disclosure, the at least two inorganic material-containing layers can be disposed at various positions to minimize or reduce degradation of visibility and image quality of the display device caused by external light.

According to the present disclosure, the reliability of the display device can be improved by suppressing moisture permeation into the display device.

According to the present disclosure, the at least two inorganic material-containing layers can improve touch sensitivity by improving a dielectric constant of a touch electrode.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
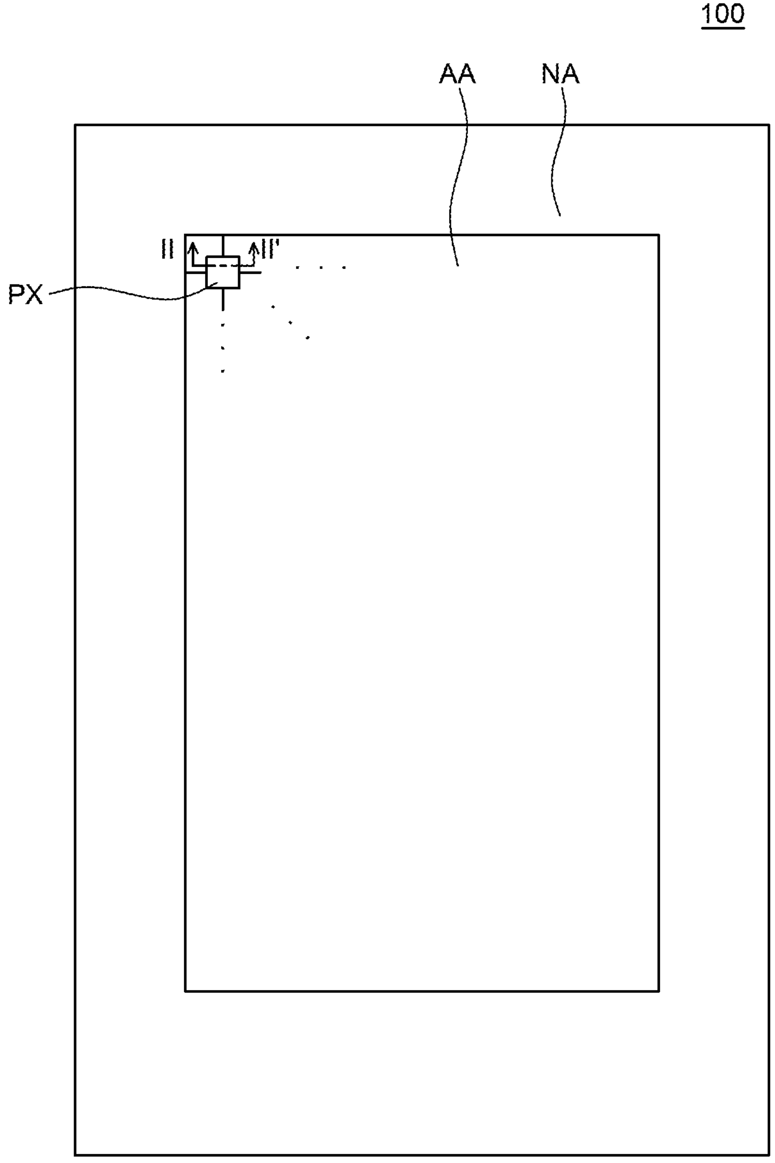
FIG. 1 is a schematic plan view of a display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as “including,” “having,” and “consist of” used herein are generally intended to allow other components to be added unless the terms are used with the term “only”. Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various embodiments of the present disclosure will be described in detail with reference to accompanying drawings.

FIG. 1 is a schematic plan view of a display device 100 according to an embodiment of the present disclosure.

Referring to FIG. 1, the display device 100 includes a substrate using glass or plastic and a plurality of gate lines and a plurality of data lines disposed on the substrate to overlap each other. The substrate may also be referred to as a first substrate.

A plurality of pixels PX is positioned at the regions of overlap of the plurality of gate lines and the plurality of data lines. An area where the plurality of subpixels PX displaying an image is disposed may be referred to as a display area AA. An area which is provided outside the display area AA and in which the plurality of subpixels PX is not disposed may be referred to as a non-display area NA.

In the display area AA, a display part DP for displaying an image and a circuit unit (or "circuit") for driving the display part DP may be formed. For example, if the display device 100 is an organic light emitting display device, the display part DP may include a light emitting element.

That is, the display part DP may include an anode, an organic emission layer on the anode and a cathode on the organic emission layer. The organic emission layer may be composed of, for example, a hole transport layer, a hole injection layer, an organic emission layer, an electron injection layer and an electron transport layer. However, if the display device 100 is a liquid crystal display device, the display part DP may be configured to include a liquid crystal layer. Hereinafter, for the convenience of description, the display device 100 will be assumed as an organic light emitting display device, but is not limited thereto.

The circuit unit may include various transistors, capacitors and lines for driving light emitting elements. For example, the circuit unit may be composed of various components such as a driving transistor, a switching transistor, a storage capacitor, a gate line and a data line, but is not limited thereto.

The non-display area NA is an area where no image is displayed and various lines and circuits for driving the display part DP disposed in the display area AA are disposed.

As shown in FIG. 1, the non-display area NA may be defined as an area which encloses the display area AA, but is not limited thereto. The non-display area NA may be defined as an area extending from the display area AA. Also, the non-display area NA may be defined as an area extending from a plurality of sides of the display area AA.

In the non-display area NA, a COF, an FPCB and the like in which various ICs, such as a gate driver IC and a data driver IC, and driving circuits are disposed may be disposed. Also, in the non-display area NA, a driving circuit referred to as a gate-in panel (GIP) may be disposed.

Further, the display device 100 may have flexibility. Therefore, the display device 100 may be variously deformed such as being curved, folded, bent or rolled while maintaining display quality.

Hereinafter, a cross-sectional structure of the display area AA of the display device 100 will be described in more detail with further reference to FIG. 2.

Figure 2:
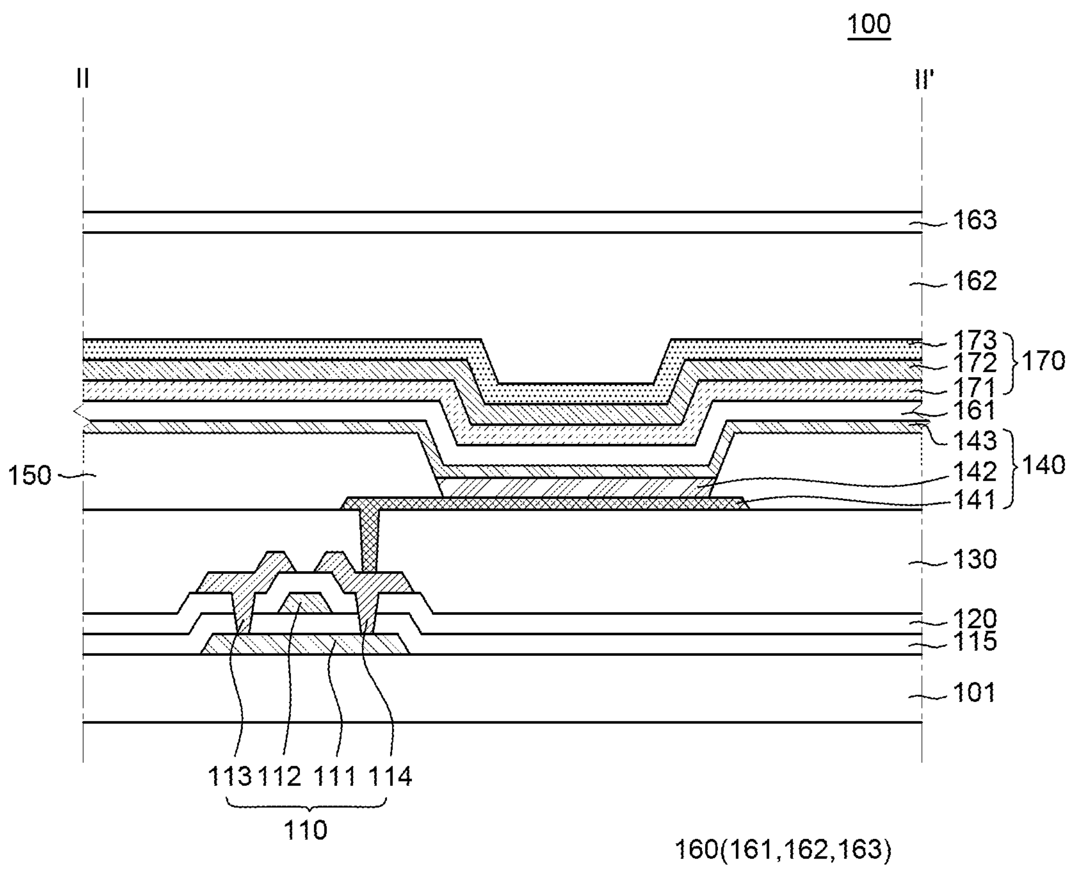
FIG. 2 is a schematic cross-sectional view as taken along a line II-II' of FIG. 1.

FIG. 2 is a schematic cross-sectional view as taken along a line II-II' of FIG. 1. Specifically, FIG. 2 is a cross-sectional view of a pixel PX in the display area AA of the display device 100 according to an embodiment of the present disclosure.

Referring to FIG. 2, a first substrate 101 supports various components of the display device 100. The first substrate 101 may be made of a transparent insulating material such as glass or plastic. For example, the first substrate 101 includes a substrate using glass or plastic. For example, if the first substrate 101 includes an insulating plastic substrate selected from polyimide, polyethersulfone, polyethylene terephthalate and polycarbonate, the first substrate 101 may have flexibility.

In the display area AA of the first substrate 101, a display part DP including a transistor 110 and a light emitting diode 140 is disposed.

The transistor 110 drives each pixel PX, and includes an active layer 111, a gate electrode 112, a source electrode 113 and a drain electrode 114.

The active layer 111 is disposed on the first substrate 101. The active layer 111 may be made of polycrystalline silicon (p-Si), amorphous silicon (a-Si) or oxide semiconductor, but is not limited thereto.

A gate insulating layer 115 is disposed on the first substrate 101 and the active layer 111. The gate insulating layer 115 may be made of silicon oxide (SiOx), silicon nitride (SiNx) or a multilayer thereof.

The gate electrode 112 is disposed on the gate insulating layer 115. The gate electrode 112 is disposed on the gate insulating layer 115 so as to overlap the active layer 111. The gate electrode 112 may be made of various conductive materials such as magnesium (Mg), aluminum (Al), nickel (Ni), chromium (Cr), molybdenum (Mo), tungsten (W), gold (Au) or an alloy thereof, but is not limited thereto.

An inter-insulating-layer 120 is disposed on the gate insulating layer 115 and the gate electrode 112. The inter-insulating-layer 120 may be made of silicon oxide (SiOx), silicon nitride (SiNx) or a multilayer thereof.

The source electrode 113 and the drain electrode 114 are disposed on the inter-insulating-layer 120. The source electrode 113 and the drain electrode 114 are electrically connected to the active layer 111 through contact holes formed in the gate insulating layer 115 and the inter-insulating-layer 120. The source electrode 113 and the drain electrode 114 may be made of various conductive materials such as magnesium (Mg), aluminum (Al), nickel (Ni), chromium (Cr), molybdenum (Mo), tungsten (W), gold (Au) or an alloy thereof, but is not limited thereto.

Although not illustrated in the drawings, a buffer layer may be located between the first substrate 101 and the transistor 110, specifically, between the first substrate 101 and the active layer 111. The buffer layer is a layer for protecting the transistor 110 against impurities like alkali ions flowing out from the first substrate 101 or lower layers. The buffer layer may be made of silicon oxide (SiOx), silicon nitride (SiNx) or a multilayer thereof.

A planarization layer 130 is disposed on the transistor 110. The planarization layer 130 protects the transistor 110 and planarizes an upper portion of the transistor 110. The planarization layer 130 may be made of an organic insulating film such as benzocyclobutene (BCB) or acryl, but is not limited thereto.

The light emitting diode 140 is disposed on the planarization layer 130. The light emitting diode 140 includes an anode 141, an organic emission layer 142 and a cathode 143.

The anode 141 is formed on the planarization layer 130 to correspond to an emission area of each pixel. The anode 141 may be electrically connected to the drain electrode 114 of the transistor 110 through a contact hole formed in the planarization layer 130. The anode 141 is made of a metallic material having a low work function. If the display device 100 is of a top emission type, the anode 141 may further include a transparent conductive layer and a reflection layer on the transparent conductive layer. The transparent conductive layer may be made of a transparent conductive oxide such as ITO or IZO. The reflection layer may be made of, for example, silver (Ag), aluminum (Al), gold (Au), molybdenum (Mo), tungsten (W), chromium (Cr) or an alloy thereof.

A bank layer 150 may be formed in the entire area except the emission area. The bank layer 150 may expose the anode 141 corresponding to the emission area. The bank layer 150 may be made of an inorganic insulating material such as a silicon nitride film (SiNx) or a silicon oxide film (SiOx). Alternatively, the bank layer 150 may be made of an organic insulating material such as benzocyclobutene (BCB)-based resin, acrylic resin or imide-based resin. However, the present disclosure is not limited thereto.

Although not illustrated in the drawings, a spacer may be further formed on the bank layer 150. The spacer may be made of the same material as the bank layer 150. The spacer may serve to protect the light emitting diode 140 from being damaged by a fine metal mask (FMM) used in patterning the organic emission layer 142.

The organic emission layer 142 is disposed on the anode 141 exposed by the bank layer 150. The organic emission layer 142 may include a hole injection layer, a hole transport layer, an emission layer, an electron transport layer, an electrode injection layer and the like. The organic emission layer 142 may have a structure of a single emission layer that emits a single light, or may have a structure of a plurality of emission layers that emits a white light.

The cathode 143 is disposed on the organic emission layer 142. If the display device 100 is of a top emission type, the cathode 143 may be made of a metallic material having a small thickness and a high work function.

An encapsulation part 160 is disposed on the cathode 143 of the light emitting diode 140. The encapsulation part 160 may protect the light emitting diode 140 from moisture and oxygen. If the light emitting diode 140 is exposed to moisture or oxygen, pixel shrinkage phenomenon in which the light emitting diode 140 is reduced may be generated or a dark spot may be generated in the emission area.

For example, the encapsulation part 160 may include a first inorganic insulating film 161, an organic insulating film 162 and a second inorganic insulating film 163. The first inorganic insulating film 161 and the second inorganic insulating film 163 may be made of an inorganic insulating material such as silicon nitride (SiNx), silicon oxide (SiOx), silicon oxynitride (SiON) or aluminum oxide ($Al_2O_3$). The organic insulating film 162 may be made of an organic insulating material. In this case, the first inorganic insulating film 161 and the second inorganic insulating film 163 serve to block permeation of moisture or oxygen. Also, the organic insulating film 162 serves to planarize an upper portion of the first inorganic insulating film 161. However, the configuration of the encapsulation part 160 is not limited thereto.

In a conventional display device, a polarizing plate is disposed on an encapsulation part in order to suppress degradation of visibility, contrast ratio and the like caused by external light incident into the display device from the outside. However, when the conventional display device including the polarizing plate is folded or rolled at an extreme curvature, cracks may occur in the polarizing plate due to a large thickness of the polarizing plate or a bent shape of the polarizing plate can be recognized by a user. Also, manufacturing costs of the display device may increase due to the polarizing plate which is expensive.

In the display device 100 according to an embodiment of the present disclosure, at least two inorganic material-containing layers 170 are provided in the display device 100 to substitute for the conventionally used polarizing plate. Therefore, a problem with visibility caused by external light can be solved at low cost. Also, the thickness can be reduced as compared to the conventionally used polarizing plate, which enables the display device 100 to be foldable or rollable.

Specifically, according to an embodiment of the present disclosure, the at least two inorganic material-containing layers 170 may be disposed on the display part DP including the transistor 110 and the light emitting diode 140. Preferably, the inorganic material-containing layer 170 may be disposed between the first inorganic insulating film 161 and the organic insulating film 162 of the encapsulation part 160 disposed on the display part DP.

The at least two inorganic material-containing layers 170 may include a first anti reflection layer 171, a second anti reflection layer 172 disposed on the first anti reflection layer 171 and having a smaller refractive index than the first anti reflection layer 171 and a first light absorbing layer 173 on the second anti reflection layer 172.

The at least two inorganic material-containing layers 170 may be disposed on the display part DP to suppress reflection of external light, which is incident from the outside, by the display part DP. Specifically, external light reflected by a metallic layer (e.g., the cathode 143) where reflection of external light usually occurs in the display device 100 may disappear due to refraction at the interface between the first anti reflection layer 171 and the second anti reflection layer 172 having different refractive indexes each other and interference of the reflected light.

The first anti reflection layer 171 may have a refractive index of greater than 1.5 and less than or equal to 1.9. For example, the first anti reflection layer 171 may contain at least one selected from the group consisting of silicon nitride (SiNx), aluminum oxide ($Al_2O_3$), gallium oxide ($Ga_2O_3$), magnesium oxide (MgO), silicon oxynitride (SiON), strontium titanate ($SrTiO_3$), tungsten oxide ($WO_3$) or combinations thereof.

The second anti reflection layer 172 may have a refractive index of 1.5 or less, for example, from 1.0 to 1.5. For example, the second anti reflection layer 172 may contain at least one selected from the group consisting of silicon oxide ($SiO_2$), magnesium fluoride ($MgF_2$), zircon ($ZrO_2SiO_2$) or combinations thereof.

Most of the external light disappears due to refraction at the interface between the first anti reflection layer 171 and the second anti reflection layer 172 and interference of the reflected light, but some of the external light may remain. According to an embodiment of the present disclosure, the first light absorbing layer 173 is disposed on the second anti reflection layer 172 to absorb the remaining external light at the interface between the first anti reflection layer 171 and the second anti reflection layer 172.

The first light absorbing layer 173 may contain a metal having a high light absorption. Preferably, the first light absorbing layer 173 may contain a metal selected from the group consisting of titanium (Ti), tungsten (W) or combinations thereof. It should be understood that other metals may be included instead of or in addition to those listed.

Also, the first light absorbing layer 173 may have a surface roughness of greater than 2 nm and less than or equal to 5 nm, for example, from 3 nm to 5 nm. Herein, the surface roughness is a physical quantity representing the degree of roughness of a specific surface. The surface roughness may be defined as a root mean square (RMS) value of height values of a curved surface of the actual first light absorbing layer 173 with respect to an ideally flat reference plane. When the surface of the first light absorbing layer 173 is ideally flat, the reference plane refers to the same plane as the surface and becomes a referential point for measuring a height. For example, as the surface roughness value decreases, the surface becomes flatter.

As described above, the at least two inorganic material-containing layers 170 are disposed between the first inorganic insulating film 161 and the organic insulating film 162 of the encapsulation part 160. In this case, the organic insulating film 162 is disposed on the first light absorbing layer 173.

In this case, the organic insulating film 162 may be disposed on the first light absorbing layer 173 by coating an organic insulating material in a liquid state on the entire surface of the first light absorbing layer 173. In this case, if the first light absorbing layer 173 has a surface roughness of greater than 2 nm and less than or equal to 5 nm, spreadability of the organic insulating film 162 disposed on the first light absorbing layer 173 can be improved. Thus, the organic insulating film 162 can be coated on the first light absorbing layer 173 so as to cover the entire first light absorbing layer 173. The organic insulating film 162 may be coated on the first light absorbing layer 173 and may planarize an upper portion of the first light absorbing layer 173.

If the upper portion is planarized by the organic insulating film 162, the second inorganic insulating film 163 disposed on the organic insulating film 162 is also disposed on the flat surface. Therefore, it is possible to suppress the occurrence of cracks in the second inorganic insulating film 163. Accordingly, the second inorganic insulating film 163 may minimize, reduce or block permeation of moisture or oxygen from the outside into the first inorganic insulating film 161 and the organic insulating film 162 disposed thereunder. Thus, it is possible to block permeation of moisture into the display part DP disposed under the encapsulation part 160.

Also, each of the at least two inorganic material-containing layers 170 according to an embodiment of the present disclosure is a layer containing inorganic material and thus may be formed by deposition. Therefore, the at least two inorganic material-containing layers 170 may have freedom of lamination and thus may be disposed at any position within the display device 100.

Figure 3:
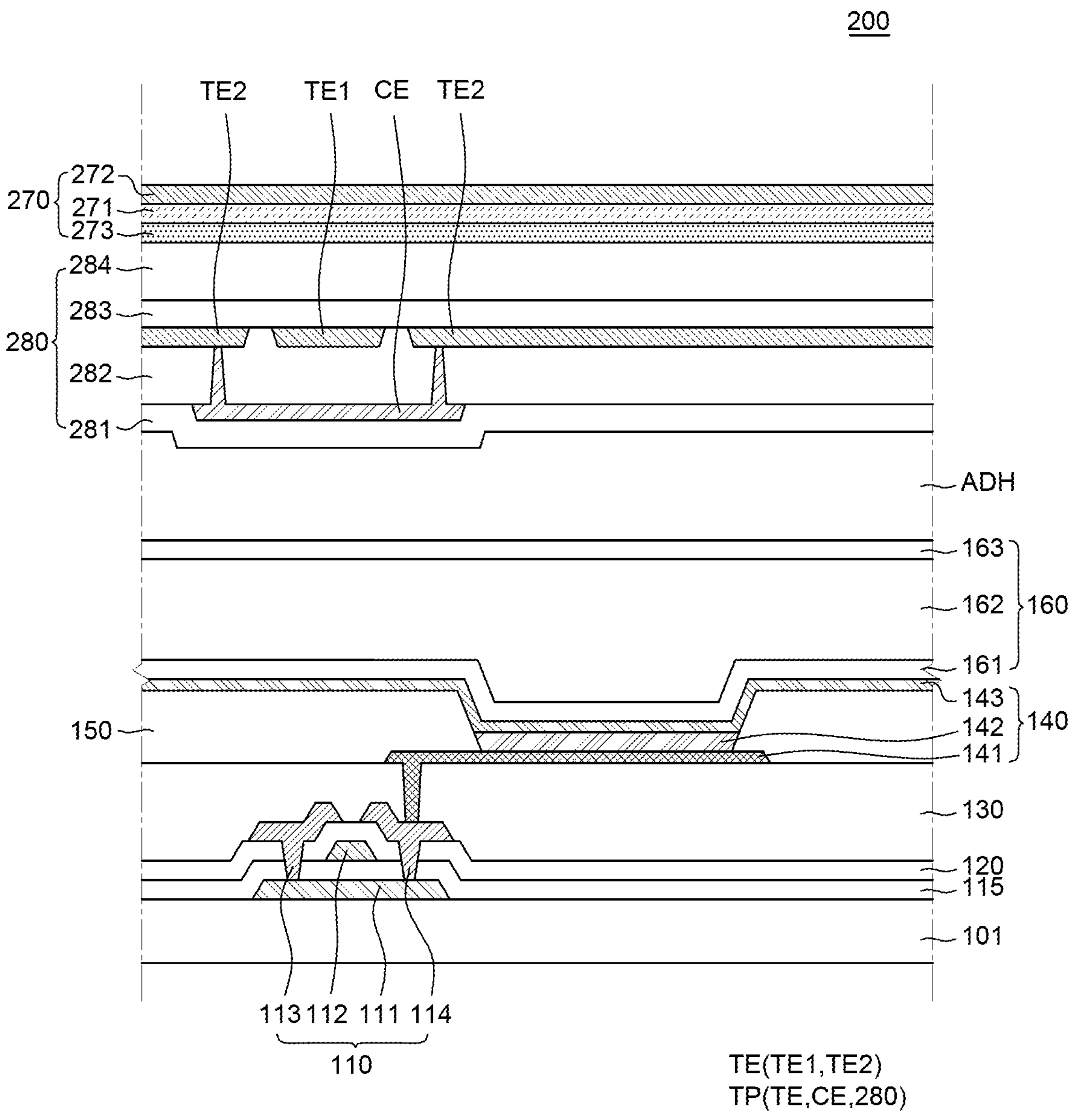
FIG. 3 is a schematic cross-sectional view of a display device according to another embodiment of the present disclosure.

FIG. 3 is a schematic cross-sectional view of a display device according to another embodiment of the present disclosure. A display device 200 shown in FIG. 3 is substantially the same as the display device 100 shown in FIG. 1 and FIG. 2 except that the display device 200 further includes a touch panel TP and at least two inorganic material-containing layers 270 are disposed on the touch panel TP. Therefore, a redundant description thereof will be omitted.

The display device 200 may further include the touch panel TP on the encapsulation part 160.

For example, the touch panel TP may be directly formed on the encapsulation part 160, or may be bonded onto the encapsulation part 160 by an adhesive layer ADH. Hereinafter, for the convenience of description, an example where the touch panel TP is bonded onto the encapsulation part 160 by the adhesive layer ADH will be described, but the present disclosure is not limited thereto.

The adhesive layer ADH is made of an adhesive material for bonding the encapsulation part 160 and the touch panel TP. The adhesive layer ADH may serve to seal the light emitting diode 140 to protect the light emitting diode 140 against moisture or oxygen permeating from the outside of the display device 200. The adhesive layer ADH may be made of various materials. For example, the adhesive layer ADH may be made of various adhesive materials such as optical clear adhesive (OCA) or optical clear resin (OCR).

The touch panel TP disposed on the encapsulation part 160 includes a plurality of touch insulating layers 280 and a touch electrode TE.

A plurality of touch insulating layers 280 may include a touch protection layer 281, a touch inter-insulating-layer 282 on the touch protection layer 281, a barrier layer 283 on the touch inter-insulating-layer 282 and a touch planarization layer 284 on the barrier layer 283.

The touch protection layer 281 is in contact with the adhesive layer ADH when the touch panel TP is bonded to the encapsulation part 160 by the adhesive layer ADH. The touch protection layer 281 may be made of an inorganic insulating material. For example, the touch protection layer 281 may be made of silicon oxide (SiOx), silicon nitride (SiNx) or a multilayer thereof. The touch protection layer 281 may protect the touch electrode TE and a connection electrode CE disposed on the touch protection layer 281.

The connection electrode CE is disposed on the touch protection layer 281. The connection electrode CE is disposed at a region of overlap between the touch electrodes TE disposed in different directions from each other and connects the touch electrodes TE disposed in any one direction. The connection electrode CE may be formed as a transparent conductive layer or made of a transparent conductive oxide such as ITO or IZO.

The touch inter-insulating-layer 282 may be disposed on the connection electrode CE and the touch protection layer 281. The touch inter-insulating-layer 282 may insulate between the connection electrode CE and the touch electrode TE. The touch inter-insulating-layer 282 may be made of an organic insulating material such as an acryl-based, epoxy-based or siloxane-based material.

The barrier layer 283 may be disposed to cover the touch electrode TE. The barrier layer 283 may be formed as an inorganic film. For example, the barrier layer 283 may be made of silicon oxide (SiOx), silicon nitride (SiNx) or a multilayer thereof. The barrier layer 283 may suppress damage to the touch electrode TE caused by moisture from the outside.

The touch planarization layer 284 is disposed on the barrier layer 283. The touch planarization layer 284 is disposed such that the barrier layer 283 is not exposed to the outside, and may substantially function as a substrate. The touch planarization layer 284 may be made of an organic insulating material such as an acryl-based, epoxy-based or siloxane-based material.

The at least two inorganic material-containing layers 270 may be disposed on the touch panel TP.

In this case, the at least two inorganic material-containing layers 270 include a first light absorbing layer 273, a first anti reflection layer 271 on the first light absorbing layer 273 and a second anti reflection layer 272 on the first anti reflection layer 271.

The at least two inorganic material-containing layers 270 may be disposed on the touch panel TP to suppress reflection of external light, which is incident from the outside, by the display part DP including the transistor 110 and the light emitting diode 140 or the touch panel TP. An example where external light is reflected by the display part DP has been described above. Therefore, hereinafter, for the convenience of description, an example where external light is reflected by the touch panel TP will be described. However, the present disclosure is not limited thereto.

External light reflected by a metallic layer (e.g., the touch electrode TE or the connection electrode CE) where reflection of external light usually occurs in the touch panel TP may be absorbed by the first light absorbing layer 273. In this case, the first light absorbing layer 273 may contain a metal having a high light absorption. Preferably, the first light absorbing layer 273 may contain a metal selected from the group consisting of titanium (Ti), tungsten (W) or combinations thereof.

Because the first light absorbing layer 273 is made of a metal selected from the group consisting of titanium (Ti), tungsten (W) or combinations thereof, the first light absorbing layer 273 has a high dielectric constant. Due to the high dielectric constant, touch sensitivity of the display device 200 can be improved.

Meanwhile, all the remaining external light which cannot be absorbed by the first light absorbing layer 273 disappears due to refraction at the interface between the first anti reflection layer 271 and the second anti reflection layer 272 disposed on the first light absorbing layer 273 and interference of the reflected light.

The first anti reflection layer 271 may have a refractive index of greater than 1.9, preferably greater than 1.9 and less than or equal to 2.7. For example, the first anti reflection layer 271 may contain at least one selected from the group consisting of zinc oxide (ZnO), indium oxide ($In_2O_3$), titanium oxide ($TiO_2$), zirconium oxide ($ZrO_2$), tin oxide (SnOx), cerium oxide ($CeO_2$) or combinations thereof.

The second anti reflection layer 272 may have a refractive index of 1.5 or less, preferably, from 1.0 to 1.5. For example, the second anti reflection layer 272 may contain at least one selected from the group consisting of silicon oxide ($SiO_2$), magnesium fluoride ($MgF_2$), zircon ($ZrO_2SiO_2$) or combinations thereof.

Figure 4:
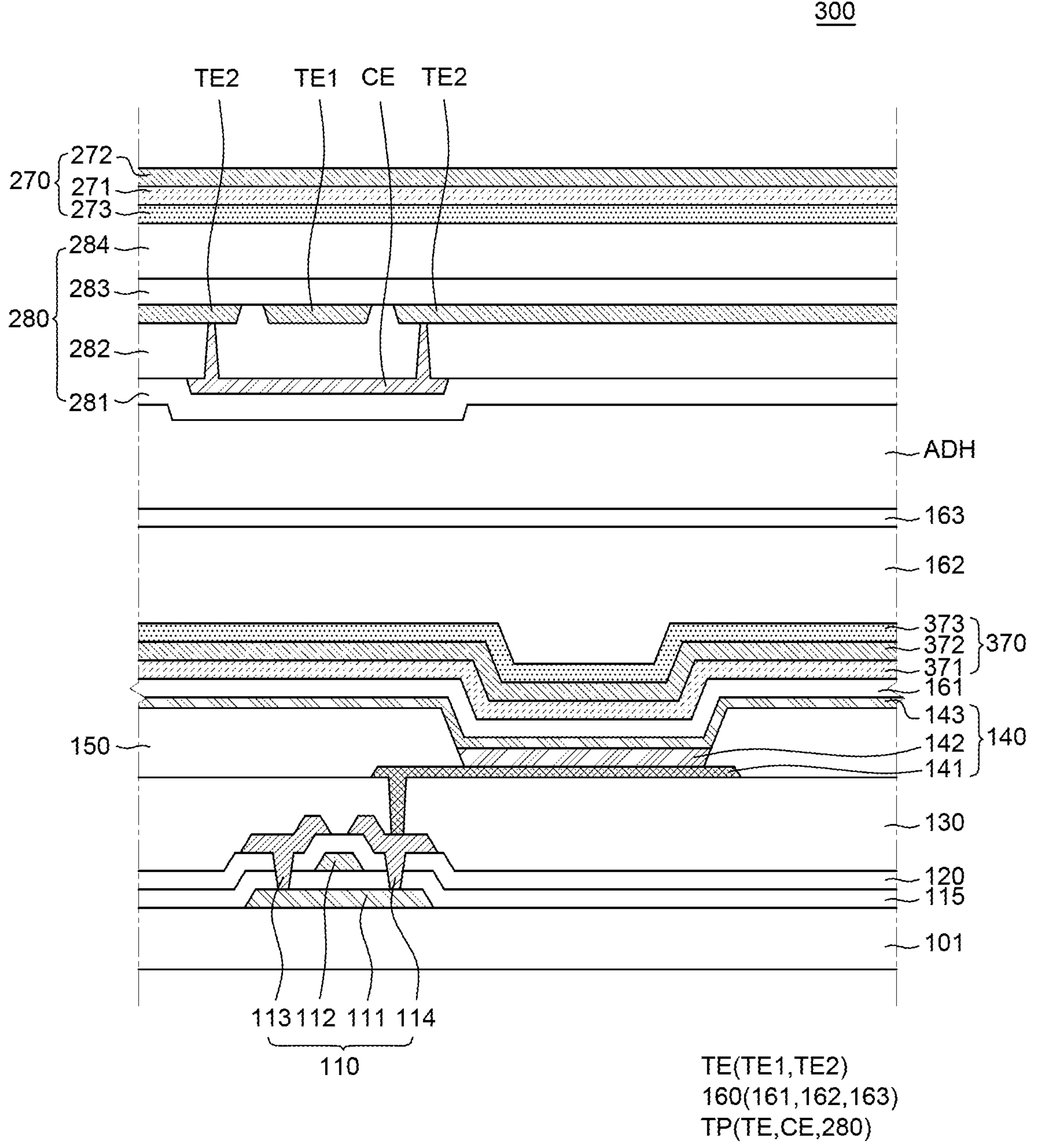
FIG. 4 is a schematic cross-sectional view of a display device according to yet another embodiment of the present disclosure.

FIG. 4 is a schematic cross-sectional view of a display device according to yet another embodiment of the present disclosure. A display device 300 shown in FIG. 4 is substantially the same as the display device 200 shown in FIG. 3 except that at least two inorganic material-containing layers further include a second light absorbing layer 373, a third anti reflection layer 371 and a fourth anti reflection layer 372 disposed on the display part DP. Therefore, a redundant description thereof will be omitted.

As described above, the at least two inorganic material-containing layers 270 disposed on the touch panel TP may suppress reflection of external light, which is incident from the outside, by the display part DP including the transistor 110 and the light emitting diode 140 or the touch panel TP.

In this case, the display device 300 according to yet another embodiment of the present disclosure may further include the third anti reflection layer 371 on the display part DP disposed, preferably, between the first inorganic insulating film 161 and the organic insulating film 162, the fourth anti reflection layer 372 on the third anti reflection layer 371 and the second light absorbing layer 373 on the fourth anti reflection layer 372 in addition to the at least two inorganic material-containing layers 270 disposed on the touch panel TP.

Hereinafter, for the convenience of description, the at least two inorganic material-containing layers 270 including the first light absorbing layer 273 disposed on the touch panel TP, the first anti reflection layer 271 on the first light absorbing layer 273 and the second anti reflection layer 272 on the first anti reflection layer 271 will be referred to as a plurality of first inorganic material-containing layers 270. Also, the at least two inorganic material-containing layers 370 including the third anti reflection layer 371 on the display part DP, the fourth anti reflection layer 372 on the third anti reflection layer 371 and the second light absorbing layer 373 on the fourth anti reflection layer 372 will be referred to as a plurality of second inorganic material-containing layers 370.

If the display device 300 further includes a plurality of second inorganic material-containing layers 370 disposed on the display part DP, a plurality of second inorganic material-containing layers 370 may suppress reflection of external light, which is incident from the outside, by the display part DP. Specifically, external light reflected by a metallic layer where reflection of external light usually occurs may in the display device 300 may disappear due to refraction at the interface between the third anti reflection layer 371 and the fourth anti reflection layer 372 having different refractive indexes and interference of the reflected light.

Some of the external light may not disappear due to refraction at the interface between the third anti reflection layer 371 and the fourth anti reflection layer 372 and interference of the reflected light, but may remain. In this case, all the remaining external light may be absorbed by the second light absorbing layer 373 on the fourth anti reflection layer 372.

Accordingly, if the display device 300 includes a plurality of first inorganic material-containing layers 270 on the touch panel TP and a plurality of second inorganic material-containing layers 370 on the display part DP together, degradation of visibility caused by external light incident into the display device 300 can be solved more reliably.

In this case, the third anti reflection layer 371 may have a refractive index of greater than 1.5 and less than or equal to 1.9. For example, the third anti reflection layer 371 may contain at least one selected from the group consisting of silicon nitride (SiNx), aluminum oxide ($Al_2O_3$), gallium oxide ($Ga_2O_3$), magnesium oxide (MgO), silicon oxynitride (SiON), strontium titanate ($SrTiO_3$), tungsten oxide ($WO_3$) or combinations thereof.

The fourth anti reflection layer 372 may have a refractive index of 1.5 or less, preferably, from 1.0 to 1.5. For example, the fourth anti reflection layer 372 may contain at least one selected from the group consisting of silicon oxide ($SiO_2$), magnesium fluoride ($MgF_2$), zircon ($ZrO_2SiO_2$) or combinations thereof.

The second light absorbing layer 373 may contain a metal having a high light absorption. Preferably, the second light absorbing layer 373 may contain a metal selected from the group consisting of titanium (Ti), tungsten (W) or combinations thereof.

Also, the second light absorbing layer 373 may have a surface roughness having an RMS value of greater than 2 nm and less than or equal to 5 nm. Therefore, spreadability of the organic insulating film 162 disposed on the second light absorbing layer 373 can be improved. Thus, the organic insulating film 162 may be disposed on the second light absorbing layer 373 so as to cover the entire second light absorbing layer 373. Also, the organic insulating film 162 may planarize an upper portion of the second light absorbing layer 373.

If the upper portion is planarized by the organic insulating film 162, the second inorganic insulating film 163 disposed on the organic insulating film 162 is also disposed on the flat surface. Therefore, it is possible to suppress the occurrence of cracks in the second inorganic insulating film 163. Accordingly, the second inorganic insulating film 163 may minimize, reduce or block permeation of moisture or oxygen from the outside into the first inorganic insulating film 161 and the organic insulating film 162 disposed thereunder. Thus, it is possible to block permeation of moisture into the display part DP disposed under the encapsulation part 160.

As described above, if the display device 300 includes a plurality of first inorganic material-containing layers 270 on the touch panel TP and a plurality of second inorganic material-containing layers 370 on the display part DP together, degradation of visibility caused by external light incident into the display device 300 can be reduced more reliably. Also, permeation of moisture into the display part DP of the display device 300 can be suppressed easily. Therefore, it is possible to improve reliability of the display device 300.

The embodiments of the present disclosure can also be described as follows:

According to an aspect of the present disclosure, A display device, comprising a first substrate; a display part on the first substrate; an encapsulation part covering the display part; and at least two inorganic material-containing layers, wherein the at least two inorganic material-containing layers include a first light absorbing layer, a first anti reflection layer and a second anti reflection layer disposed on the first anti reflection layer and having a smaller refractive index than the first anti reflection layer.

The at least two inorganic material-containing layers may be disposed on the display part.

The encapsulation part includes a first inorganic insulating film, an organic insulating film on the first inorganic insulating film and a second inorganic insulating film on the organic insulating film, and the at least two inorganic material-containing layers may be disposed between the first inorganic insulating film and the organic insulating film.

The first light absorbing layer may be disposed on the second anti reflection layer.

The first light absorbing layer may have a surface roughness of greater than 2 nm and less than or equal to 5 nm.

The first anti reflection layer has a refractive index of greater than 1.5 and less than or equal to 1.9, and the second anti reflection layer may have a refractive index of 1.5 or less.

The first anti reflection layer may contain at least one selected from the group consisting of silicon nitride (SiNx), aluminum oxide ($Al_2O_3$), gallium oxide ($Ga_2O_3$), magnesium oxide (MgO), silicon oxynitride (SiON), strontium titanate ($SrTiO_3$), tungsten oxide ($WO_3$) or combinations thereof, and the second anti reflection layer contains at least one selected from the group consisting of silicon oxide ($SiO_2$), magnesium fluoride ($MgF_2$), zircon ($ZrO_2SiO_2$) or combinations thereof.

The display device further comprises a touch panel on the encapsulation part, the at least two inorganic material-containing layers may be disposed on the touch panel.

The first light absorbing layer may be disposed under the first anti reflection layer.

The first anti reflection layer may have a refractive index of greater than 1.9, and the second anti reflection layer may have a refractive index of 1.5 or less.

The first anti reflection layer may contain at least one selected from the group consisting of zinc oxide (ZnO), indium oxide ($In_2O_3$), titanium oxide ($TiO_2$), zirconium oxide ($ZrO_2$), tin oxide (SnOx), cerium oxide ($CeO_2$) or combinations thereof, and the second anti reflection layer contains at least one selected from the group consisting of silicon oxide ($SiO_2$), magnesium fluoride ($MgF_2$), zircon ($ZrO_2SiO_2$) or combinations thereof.

The at least two inorganic material-containing layers may further include a third anti reflection layer disposed on the display part, a fourth anti reflection layer disposed on the third anti reflection layer and having a smaller refractive index than the third anti reflection layer and a second light absorbing layer disposed on the fourth anti reflection layer.

The encapsulation part includes a first inorganic insulating film, an organic insulating film on the first inorganic insulating film and a second inorganic insulating film on the organic insulating film, and the second light absorbing layer, the third anti reflection layer and the fourth anti reflection layer may be disposed between the first inorganic insulating film and the organic insulating film.

The second light absorbing layer may have a surface roughness of greater than 2 nm and less than or equal to 5 nm.

The third anti reflection layer may have a refractive index of greater than 1.5 and less than or equal to 1.9, and the fourth anti reflection layer may have a refractive index of 1.5 or less.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:

a first substrate;

a display part disposed on the first substrate and including a transistor and a light emitting diode;

an encapsulation part covering the display part; and at least two inorganic material-containing layers, wherein the at least two inorganic material-containing layers include a first light absorbing layer, a first anti reflection layer and a second anti reflection layer disposed on the first anti reflection layer and having a smaller refractive index than the first anti reflection layer, and wherein the encapsulation part includes a first inorganic insulating film, an organic insulating film on the first inorganic insulating film, and a second inorganic insulating film on the organic insulating film, and the at least two inorganic material-containing layers are disposed between the first inorganic insulating film and the organic insulating film.

2. The display device according to claim 1, wherein the at least two inorganic material-containing layers are disposed on the display part.

3. The display device according to claim 2, wherein the first light absorbing layer is disposed on the second anti reflection layer.

4. The display device according to claim 3, wherein the first light absorbing layer has a surface roughness of greater than 2 nm and less than or equal to 5 nm.

5. The display device according to claim 2, wherein the first anti reflection layer has a refractive index of greater than 1.5 and less than or equal to 1.9, and the second anti reflection layer has a refractive index of 1.5 or less.

6. The display device according to claim 5, wherein the first anti reflection layer contains at least one of silicon nitride (SiNx), aluminum oxide ($Al_2O_3$), gallium oxide ($Ga_2O_3$), magnesium oxide (MgO), silicon oxynitride (SiON), strontium titanate ($SrTiO_3$), tungsten oxide ($WO_3$) or combinations thereof, and the second anti reflection layer contains at least one of silicon oxide ($SiO_2$), magnesium fluoride ($MgF_2$), zircon ($ZrO_2SiO_2$) or combinations thereof.

7. A display device, comprising:

a first substrate;

a display part disposed on the first substrate and including a transistor and a light emitting diode;

an encapsulation part covering the display part;

at least two inorganic material-containing layers; and a touch panel on the encapsulation part, wherein the at least two inorganic material-containing layers include a first light absorbing layer, a first anti reflection layer and a second anti reflection layer disposed on the first anti reflection layer and having a smaller refractive index than the first anti reflection layer, and wherein the at least two inorganic material-containing layers are disposed on the touch panel.

8. The display device according to claim 7, wherein the first light absorbing layer is disposed under the first anti reflection layer.

9. The display device according to claim 7, wherein the first anti reflection layer has a refractive index of greater than 1.9, and the second anti reflection layer has a refractive index of 1.5 or less.

10. The display device according to claim 9, wherein the first anti reflection layer contains at least one of zinc oxide, indium oxide ($In_2O_3$), titanium oxide ($TiO_2$), zirconium oxide ($ZrO_2$), tin oxide (SnOx), cerium oxide ($CeO_2$) or combinations thereof, and the second anti reflection layer contains at least one of silicon oxide ($SiO_2$), magnesium fluoride ($MgF_2$), zircon ($ZrO_2SiO_2$) or combinations thereof.

11. The display device according to claim 7, wherein the at least two inorganic material-containing layers further include a third anti reflection layer disposed on the display part, a fourth anti reflection layer disposed on the third anti reflection layer and having a smaller refractive index than the third anti reflection layer, and a second light absorbing layer disposed on the fourth anti reflection layer.

12. The display device according to claim 11, wherein the encapsulation part includes a first inorganic insulating film, an organic insulating film on the first inorganic insulating film and a second inorganic insulating film on the organic insulating film, and the second light absorbing layer, the third anti reflection layer and the fourth anti reflection layer are disposed between the first inorganic insulating film and the organic insulating film.

13. The display device according to claim 11, wherein the second light absorbing layer has a surface roughness of greater than 2 nm and less than or equal to 5 nm.

14. The display device according to claim 11, wherein the third anti reflection layer has a refractive index of greater than 1.5 and less than or equal to 1.9, and the fourth anti reflection layer has a refractive index of 1.5 or less.

15. A display device, comprising:

a first substrate;

a display part disposed on the first substrate and including a transistor and a light emitting diode; and at least two inorganic material-containing layers disposed on the display part, wherein the at least two inorganic material-containing layers include a first light absorbing layer, a first anti reflection layer and a second anti reflection layer disposed on the first anti reflection layer and having a smaller refractive index than the first anti reflection layer.

16. The display device according to claim 15, further comprising an encapsulation part covering the display part, wherein the encapsulation part includes a first inorganic insulating film, an organic insulating film on the first inorganic insulating film and a second inorganic insulating film on the organic insulating film, and at least one layer of the at least two inorganic material-containing layers are disposed between the first inorganic insulating film and the organic insulating film.

17. The display device according to claim 16, wherein the first anti reflection layer has a refractive index of greater than 1.5 and less than or equal to 1.9, and the second anti reflection layer has a refractive index of 1.5 or less.

18. The display device according to claim 16, further comprising a touch panel on the encapsulation part, wherein at least one layer of the at least two inorganic material-containing layers are disposed on the touch panel.

19. The display device according to claim 18, wherein the at least two inorganic material-containing layers further include a third anti reflection layer, a fourth anti reflection layer disposed on the third anti reflection layer and having a smaller refractive index than the third anti reflection layer, and a second light absorbing layer disposed on the fourth anti reflection layer, and the third anti reflection layer, the fourth anti reflection layer and the second light absorbing layer are disposed between the first inorganic insulating film and the organic insulating film.

* * * * *